United States Patent
Gruenwald

(10) Patent No.: US 9,023,442 B2
(45) Date of Patent: May 5, 2015

(54) METALLIZATION FOR A CAVITY HOUSING AND A NONMAGNETIC SEALED CAVITY HOUSING

(75) Inventor: Richard Gruenwald, Potsdam (DE)

(73) Assignee: Vectron International GmbH, Teltow (DE)

( * ) Notice: Subject to any disclaimer, the term of this patent is extended or adjusted under 35 U.S.C. 154(b) by 224 days.

(21) Appl. No.: 13/173,017

(22) Filed: Jun. 30, 2011

(65) Prior Publication Data
US 2012/0177853 A1    Jul. 12, 2012

(30) Foreign Application Priority Data

Jun. 30, 2010 (DE) .................. 1020 10 030 778
Oct. 15, 2010 (DE) .................. 1020 10 024 543

(51) Int. Cl.
| | | |
|---|---|---|
| A47G 19/22 | (2006.01) | |
| H01L 23/06 | (2006.01) | |
| H01L 23/055 | (2006.01) | |
| H01L 23/10 | (2006.01) | |
| H01L 23/15 | (2006.01) | |
| H03H 9/10 | (2006.01) | |
| H01L 23/00 | (2006.01) | |
| H03H 9/05 | (2006.01) | |

(52) U.S. Cl.
CPC .......... *H01L 23/06* (2013.01); *Y10T 428/24975* (2015.01); *Y10T 428/131* (2015.01); *Y10T 428/265* (2015.01); *H01L 23/055* (2013.01); *H01L 23/10* (2013.01); *H01L 23/15* (2013.01); H01L 2224/48091 (2013.01); H01L 2224/48227 (2013.01); H01L 2924/0102 (2013.01); H01L 2924/01046 (2013.01); H01L 2924/01078 (2013.01); *H01L 2924/01079* (2013.01); *H01L 2924/09701* (2013.01); *H01L 24/48* (2013.01); *H01L 2924/01327* (2013.01); *H03H 9/059* (2013.01); *H03H 9/1071* (2013.01); *H01L 2224/45124* (2013.01); H01L 2224/45144 (2013.01)

(58) Field of Classification Search
CPC .......... H01L 23/06; H01L 23/10; H01L 23/15; H01L 2924/01046; H03H 9/1071
USPC ...................................................... 428/34.4
See application file for complete search history.

(56) References Cited

U.S. PATENT DOCUMENTS

| | | | |
|---|---|---|---|
| 4,941,582 A * | 7/1990 | Morikawa et al. ......... | 220/2.1 R |
| 5,058,799 A | 10/1991 | Zsamboky | |
| 5,217,922 A | 6/1993 | Akasaki et al. | |
| 7,253,029 B2 | 8/2007 | Geisler et al. | |

FOREIGN PATENT DOCUMENTS

| | | |
|---|---|---|
| JP | 2002-353375 A | 12/2002 |
| JP | 2003-142789 A | 5/2003 |
| JP | 2005-289665 A | 10/2005 |

OTHER PUBLICATIONS

Notice of Reasons for Rejection, Japanese Patent Office for Patent Application JP 2011-145582, Jan. 15, 2014.

\* cited by examiner

*Primary Examiner* — James Yager
(74) *Attorney, Agent, or Firm* — VLP Law Group LLP; Kent H. Cheng

(57) ABSTRACT

The invention relates to a metallization for a housing, for example for surface wave components, for use in strong magnetic fields as well as a nonmagnetic hermetically sealed cavity housing.

9 Claims, 3 Drawing Sheets

METALLIZATION FOR A CAVITY HOUSING AND A NONMAGNETIC SEALED CAVITY HOUSING

PRIORITY CLAIM

Priority is claimed on the following applications: German Application No.: 102010030778.5 filed on Jun. 30, 2010; and German Application No. 102010024543.5 filed: Oct. 15, 2010, the content of which is incorporated here by reference.

BACKGROUND OF THE INVENTION

1. Field of the Invention

The invention relates to a metallization for a housing technology, for example for surface acoustic wave (SAW) components for use in strong magnetic fields, for example in magnetic resonance imaging (MRI) systems, and a hermetically sealed nonmagnetic cavity housing.

2. Description of the Related Art

To attain high resolution, MRI systems operate with a plurality of magnetic induction coils, wherein the signals for each coil are typically processed via a separate electronic circuit. Because this electronic circuit is typically operated inside an MRI system, all employed components must be completely nonmagnetic, i.e., must not include ferromagnetic materials, so as to prevent field disturbances.

Hermetically sealed housings are required for obtaining components with long-term stability, so that technically simple solutions, for example based on printed circuit board material, would not be appropriate due to reliability concerns. The invention relates to the improvement of the established housing technology based on multilayer ceramics, wherein the variant established in the industry does not achieve the desired objective because of the nickel content in the ceramic coating and because of the iron, nickel and cobalt content (Kovar, FeNi42, etc.) in the welded or soldered cover.

MRI systems require frequency filtering downstream of the signal-generating induction coils and immediately before a first signal processing. Presently, this filtering task is mainly performed by discrete filters constructed from nonmagnetic coils and capacitors. Disadvantageously, these filters have as a discrete design and require considerable space, require manual frequency tuning, resulting in high labor costs and a low edge steepness of the filters. The use of surface acoustic wave (SAW) filters significantly overcomes the aforementioned deficiencies; however, established housing technologies are mostly unsuitable because of their magnetic property.

Because of the required long-term stability of the filters, any contamination and aging of the micro-acoustic active structure disposed on the surface of the piezoelectric crystal must be prevented, thus requiring hermetically sealed housings. These housings are preferably implemented in the SAW-technology, primarily for filters having a relatively large size, on the basis of multilayer metal or ceramic housings, wherein both technologies normally use ferromagnetic materials. Whereas the former consists of iron alloys, ceramic housings typically use nickel-containing metallization systems for internal and external conductor structures, which have impermissibly strong magnetic properties. Still stronger magnetic properties furthermore result from the nickel-coated covers made of iron-nickel-cobalt (Kovar) alloys which are used for closure and are either soldered or welded with the housing— in the latter case on a sealing ring, typically made of Kovar, placed underneath.

Newer (e.g., Chip Scale Package or CSP) housing technologies for SAW components predominantly focus on smaller sizes and therefore primarily on high-frequency filters, for example for mobile radio applications.

Due to the typically relatively low filter center frequencies below or not significantly above 100 MHz required, for example, for MRI applications, these technologies are not appropriate for the described application for several reasons.

U.S. Pat. No. 7,253,029 B2 describes a technology, wherein in order to avoid magnetic properties, the adhesive nickel layer normally used with this technology and deposited directly onto the tungsten layer is replaced with a palladium layer having similar chemical, but nonmagnetic properties. To obtain stable properties in processes used for building, for example, wire bonds and soldering that are comparable with conventional nickel layers—typically having thicknesses between 2 and 10 μm—, a relatively thick palladium layer is required which is disadvantageous for cost-sensitive applications due to the high material price of the noble metal. Conversely, palladium layer thicknesses of, for example, 1 μm having manageable costs do not represent a suitable foundation for achieving mechanically stable wire bond connections, which are essential for providing electrical contact between the housing and chip.

U.S. Pat. No. 4,941,582 discloses a method for producing a layer which is stable against soldering for Low Temperature Cofired Ceramic materials (so-called LTCC materials) with copper-based metallizations having processing temperatures below 1100° C., typically below 1000° C. However, Low Temperature Cofired Ceramic materials (so-called LTCC materials, for example $Al_2O_3$ ceramic) require firing temperatures of about 1500-1700° C., which precludes the use of—low-resistance, but also low-melting—copper (melting point of ca. 1085° C.) directly on the ceramic, thus necessitating the use of materials having a high melting point, such as tungsten (melting point of ca. 3422° C.) or molybdenum (melting point of ca. 2623° C.), which are disadvantageously also relatively poor electrical conductors. In general, LTCC materials are always used when, in addition to providing only a housing, additional passive components—typically capacitors, inductors or delay lines—are to be integrated into the housing in form of ceramic intermediate layers, as described in U.S. Pat. No. 4,941,582. Disadvantageously, LTCC primarily have higher costs and lower mechanical stability compared to HTCC. Palladium and nickel are explicitly described in U.S. Pat. No. 4,941,582 as a separation layer and hence as a diffusion barrier between Cu and Au.

SUMMARY OF THE INVENTION

It is an object of the invention to disclose a metallization and a housing technology which is provides, on one hand, a low-cost micro-cavity which can be reliably hermetically sealed and is suitable, for example, for mounting SAW filter chips and which, on the other hand, does not exhibit ferromagnetic properties which could cause undesirable interferences when used in strong magnetic fields, for example inside nuclear magnetic resonance imaging systems.

The object is solved according to the invention with the features of claim 1. Advantageous embodiments and modifications of the invention are recited in the dependent claims.

The metallization according to the invention for a ceramic material has a metal-containing base layer, an adhesion layer, a solderable layer and an oxidation protection layer, wherein the adhesion layer includes palladium (is preferably entirely made of palladium) and has a layer thickness between 0.1 and 5 μm, and wherein furthermore the solderable layer is made of a non-ferromagnetic material (preferably copper).

A layer system proposed in the present invention, having a base layer (preferably made of a fired tungsten base metallization), a palladium adhesive layer, a solderable (preferably copper-) layer of adequate thickness for ensuring stable solder and wire bond connections (preferably 2-15 µm), an optional additional layer (preferably palladium intermediate layer to further increase the stability of the copper layer against alloy formation with tin-containing solders) and a non-oxidizing noble metal protection layer (preferably gold), combines the advantage of nonmagnetic properties with stable behavior with respect to solder and wire bond properties and significant cost reduction compared to the system described in U.S. Pat. No. 7,253,029. The optional additional layer (preferably a palladium intermediate layer) satisfies the desired effect for a diffusion barrier—and hence an increase in the stability—for example between copper (solderable layer) and gold (oxidation protection layer).

By using a palladium-based metallization having an optional additional diffusion barrier in conjunction with a ceramic cover, which is optionally connected with the bottom part of the housing by a hermetic seal employing metal or glass solder, a hermetically sealed, completely nonmagnetic housing can be realized, which is suitable for conventional standard assembly (die-bonding, wire-bonding) and manufacturing processes (soldering to an application PC board).

The base layer is preferably fired together with the HTCC ceramic at temperatures of 1500-1700° C. Preferred thicknesses of the sintered—however, not metallically melted—base layer are about 5-20 µm.

The adhesive layer for producing high-quality layer adhesion between the base layer (e.g., a tungsten base layer) and the structure above—after preferably chemical removal of oxides and contaminants from the base layer (e.g., the tungsten surface)—is deposited with a preferred thickness of 0.1 to 5 µm, in a particularly advantageous implementation with a thickness of 0.3 to 1.3 µm, in a still more preferred implementation with a thickness of 0.5 to 1.0 µm, and even more preferred with a thickness of 0.8 µm. The layer is preferably deposited by combining current-less and galvanic deposition. Acceptable layer thicknesses (<<0.5 µm) for stable layer adhesion cannot be attained with current-less deposition alone.

The solderable layer (preferably a copper intermediate layer) as a stable base against alloy formation in Sn-based soft solder processes (e.g., on the SMD side, i.e., at the external connections) is preferably galvanically deposited with a thickness of 2 to 15 µm. A particularly advantageous compromise between stability and processing time is achieved with 4 to 8 µm, and still more preferred with 5 to 7 µm.

The—optional—additional layer deposited above (palladium diffusion barrier) having a thickness between 0.5 and 3 µm, more preferred between 1 and 2 µm, is preferably galvanically deposited, wherein a layer with a thickness of 1 µm combines a good stability-enhancing effect with reduced deposition time and manageable costs for the noble metal.

The final oxidation protection layer (preferably gold layer) is provided for protection against oxidation and should preferably have a thickness of 0.3 to 1.5 µm—in order to prevent potential solder brittleness as a result of excess cold concentration in the application process from the end-user. Particularly preferred values are between 0.5 and 1.0 µm Preferably, an additional layer is disposed between the solderable layer and the oxidation protection layer. The additional layer preferably consists of palladium. The additional layer has preferably a layer thickness between 0.5 and 3 µm. Preferably, the adhesive layer is made entirely of palladium. Preferably, the adhesion layer has a layer thickness between 0.5 and 1.5 µm. Preferably, the base layer includes a metal with a melting point of at least 1100° C. Preferably, the base layer is made of tungsten and/or molybdenum. Preferably, the base layer has a layer thickness between 5 and 20 µm. Preferably, the oxidation protection layer is made of a noble metal. Preferably, the oxidation protection layer is made of gold. Preferably, the oxidation protection layer has a layer thickness between 0.3 and 1.5 µm. Preferably, the base layer is arranged directly on the ceramic. Preferably, the adhesion layer is arranged directly on the base layer. Preferably, the additional layer is arranged directly on the solderable layer and the oxidation protection layer is arranged directly on the additional layer. Alternatively, the oxidation protection layer is disposed directly on the solderable layer.

The ceramic according to the invention has a metallization with at least one of the aforedescribed features. Preferably, the ceramic is a HTCC ceramic. HTCC ceramics have advantages with respect to costs and mechanical stability compared to LTCC ceramics and are therefore frequently used as a standard housing when the performance advantages of LTCC ceramics with their lower electric losses and integration of passive components are not required.

The cavity housing according to the invention for receiving a component has a bottom part and a cover part, wherein the bottom part and/or the cover part includes a ceramic with a metallization having at least one of the aforedescribed features. Preferably, the component is an electronic, a mechanical and/or an optical component, particularly preferred a SAW component, still more preferred a SAW filter.

Because the cavity housing according to the invention does not include magnetic materials such as iron, nickel or cobalt, it is advantageously constructed so as not to alter magnetic fields. Such housing technology is preferably applied in the medical technology, for example in nuclear magnetic resonance imaging, because the magnetic fields which are measured to form the image should not be affected by the magnetic properties of the required circuitry.

Preferably, the ceramic according to the invention with the metallization according to the invention can be used for assembly and connection processes, in particular for die bonding and aluminum or gold wire bonding. The metallization according to the invention is particularly well suited for wire bonding. During wire bonding, in particular during aluminum-wedge-wire bonding, an intermetallic connection is formed between the bond wire and the underlying metallization (bond pad). Because the gold oxidation protection layer is comparatively thin and soft, this intermetallic connection is predominantly formed between aluminum and the layer system disposed underneath the gold. To obtain a stable weld connection, in particular with aluminum wire bonds, the bond pad must have a sufficiently planar surface. Because the fired tungsten metallization typically has a comparatively high roughness of several µm, planarization is recommended for attaining a stable wire bond connection. While copper has excellent properties for planarization and hence as a base for a stable wire bond connection in conjunction with economical processing for the generally required layer thicknesses of 2 to 15 µm, a pure palladium metallization of comparable thickness, for example as disclosed in U.S. Pat. No. 7,253,029 B2, has disadvantages due to high processing costs and with respect to the stability and reliability of attainable wire bond connections.

It can therefore be stated that the metallization according to the invention offers advantages with respect to stability and costs for an (aluminum-) wire bonding process. Regarding a metal solder plug, the metallization according to the invention has advantages relating to the wetting properties of tin-based solders.

Preferably, the ceramic according to the invention (with the metallization according to the invention) is used in a soft solder process for mounting electronic components.

The solderability in the system mounting process of the end-user is extremely important for the use of the completed electronic component. The hermetic housing seal obtained with the metal solder or glass solder must therefore be prevented from melting again during this process, because the positioning of the housing cover and therefore the hermetic seal of the component would otherwise be at risk. The metal or glass solder used for the housing seal must therefore have a higher melting temperature than the soft solders, typically SnAg, SnAgCu or SnPb, which are conventionally used in end-user assembly processes. Moreover, external solder connections must typically have adequate mechanical stability—so-called "second level reliability"—, which in turn requires good wetting, i.e., alloying properties in the solder process, but also the elimination of potentially brittle intermetallic phases, for example caused by excess gold content in the resulting alloy of common soft solders, such as SnAg, SnAgCu or SnPb.

BRIEF DESCRIPTION OF THE DRAWINGS

The invention will now be described in more detail with reference to preferred exemplary embodiment illustrated in the figures, which show in.

DETAILED DESCRIPTION OF THE PRESENTLY PREFERRED EMBODIMENTS

Figure 1:
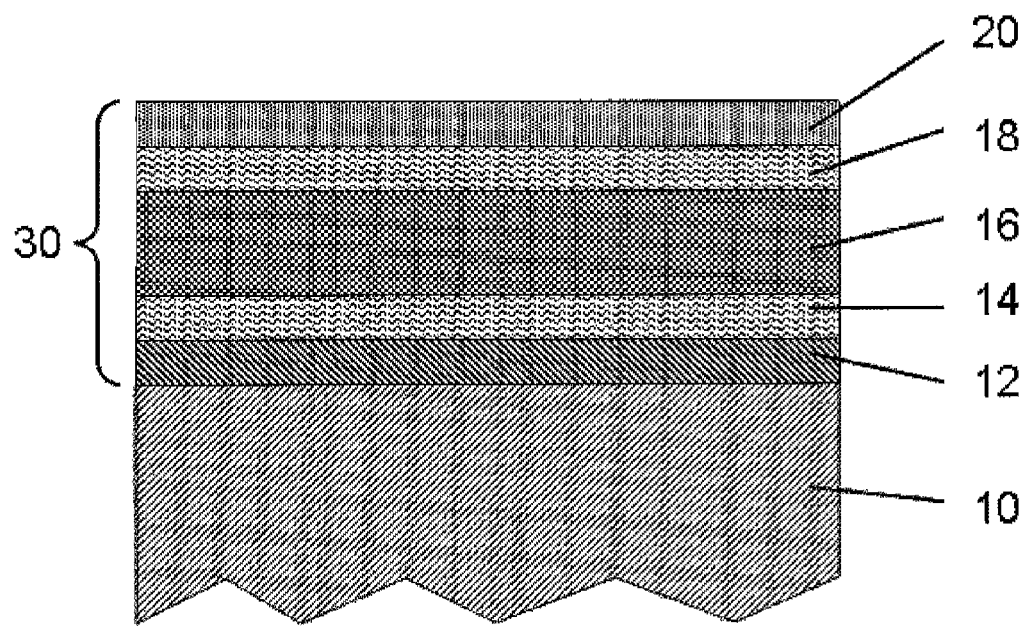
FIG. 1 a ceramic with a metallization according to the invention in accordance with a preferred embodiment of the invention in a schematic, cross-sectional view, FIG. 2 a cavity housing according to the invention in accordance with a preferred embodiment of the invention in a schematic cross-sectional view, and FIG. 3 a cavity housing according to the invention in accordance with an additional preferred embodiment of the invention in a schematic cross-sectional view.

FIG. 1 shows a ceramic 10 with a metallization 30 according to the invention in accordance with a preferred embodiment of the invention. According to this embodiment, the metallization 30 includes a tungsten or molybdenum base layer 12, a palladium adhesion layer 14 deposited thereon, a solderable copper layer 16 deposited thereon, a palladium diffusion barrier 18 deposited thereon, and a gold surface finishing 20.

The layer system 10 according to the invention provides, with the palladium metallization 14 deposited on the base layer 12, stable layer adhesion on the base, i.e., the HTCC ceramic 10, whereas the solderable layer 16 (e.g., Cu or Ag, Cu preferred) deposited thereon represents both a stable base for permanent wire bond connections as well as a layer with adequate stability against alloying in a soft-solder process. Additional stabilization against diffusion can be attained by depositing thereon an additionally palladium intermediate layer 18, wherein the layer system is then completed, for example, with a gold layer 20 for obtaining a surface which is stable against oxidation and aging.

The implementation according to the invention is therefore suitable for conventional connection processes, such as aluminum or gold wire bonding, flip-chip bonding and soldering in order to achieve mechanically and electrically stable connections.

Figure 2:
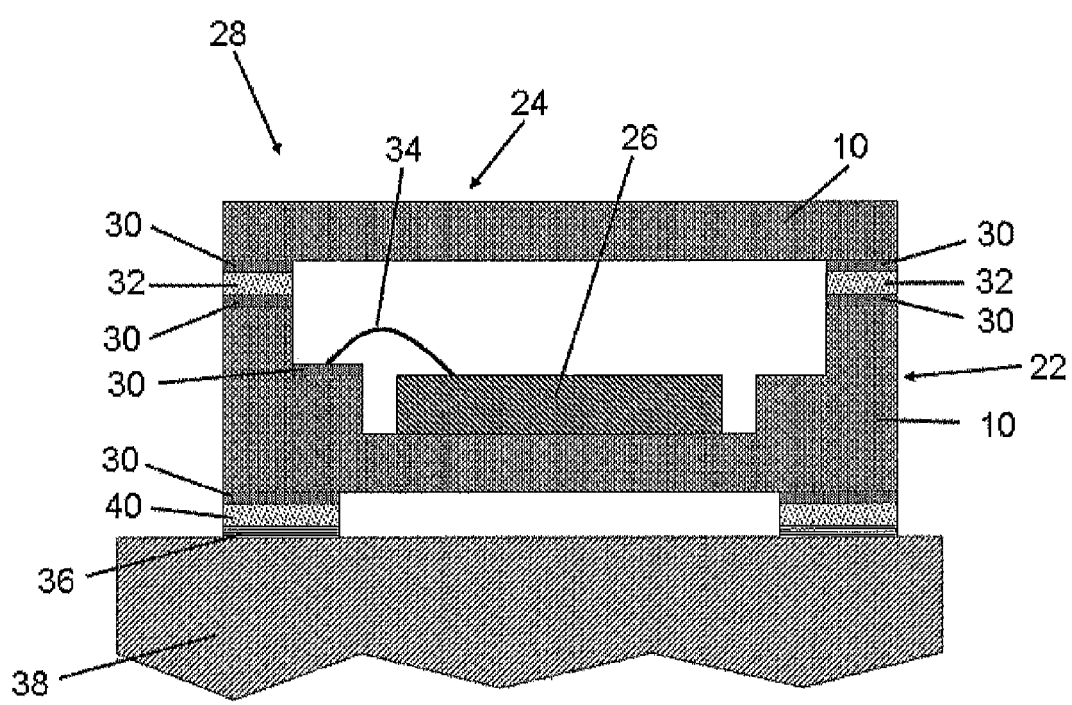

FIG. 2 shows a cavity housing according to the invention in accordance with a preferred embodiment of the invention. According to this embodiment, the cavity housing 28 has a trough-shaped bottom part 22 and a cover part 24. Both parts 22, 24 are formed from a HTCC ceramic 10—optionally each having several layers—and have in their contact regions the metallization 30 according to the invention which consists of the layers 12, 14, 16, 18 and 20 (as shown in FIG. 1). The cavity housing 28 can be used for hermetically receiving a component, for example a SAW filter 26. The produced cavity housing 28 is closed with a likewise non-ferromagnetic ceramic cover 28, which is thermally matched to the ceramic bottom part 22, with advantageous properties for the reliability of the produced housing 28. The hermetic seal between the housing bottom part 22 and the cover 24 can be produced using conventional methods. Preferred is hereby soft-soldering (optionally by using solders with a higher melting point) or glass frit soldering (optionally by using solders with a comparatively low melting point).

FIG. 2 shows a closure solution using metal soft soldering, whereby a metal solder connection 32 is produced between the respective metal systems 30 according to the invention deposited on the bottom part 22 and the cover 24. The SAW chip 26 is attached to the housing bottom part 22 with bond wires 34 by using the metallization 30 according to the invention.

The signal-conducting connections with the metallization 30 according to the invention are connected on the bottom side of the housing 28 with the wiring pattern 36 on a printed circuit board 38 by way of a solder connection 40, thereby producing the electric contact.

Figure 3:
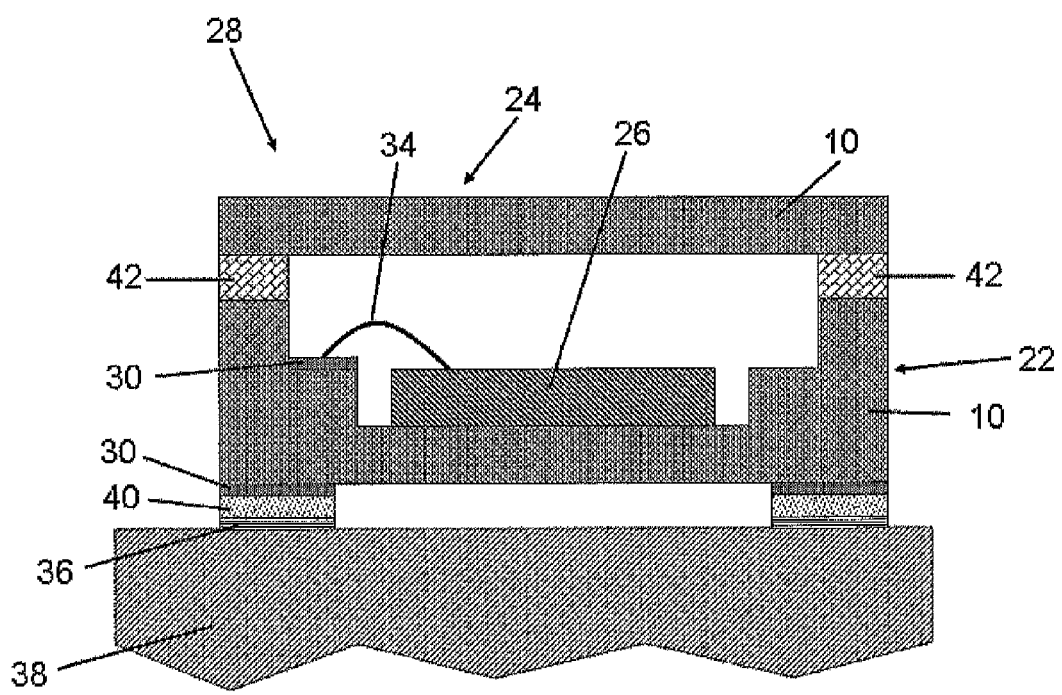

FIG. 3 shows an alternative embodiment of FIG. 2, wherein instead of the metal solder connection 32 (of FIG. 2) implemented between two metallizations 30 according to the invention a hermetically sealed closure of the housing 28 is produced with a glass frit solder connection 42 directly between the ceramic surfaces 10 (ceramic bottom part 22 and ceramic cover 24).

LIST OF REFERENCES SYMBOLS

10 Ceramic
12 Base layer
14 Adhesion layer
16 Solderable layer
18 Additional layer
20 Oxidation protection layer
22 Bottom part
24 Cover part
26 Component
28 Cavity housing
30 Metallization
32 Metal solder
34 Bond wire
36 Printed circuit board wiring
38 Printed circuit board
40 Metal solder
42 Glass frit solder

The invention claimed is:

1. A metallization layer for a ceramic, comprising:
   a base layer comprising a metal,
   an adhesion layer proximate to the base layer, wherein the adhesion layer comprises palladium and the layer thickness of the adhesion layer is between 0.1 and 5.0 μm,
   a solderable layer proximate the adhesion layer made of a non-ferromagnetic material, wherein the material of the adhesion layer is different from the material of the solderable layer, and
   an oxidation protection layer arranged over the solderable layer,
   wherein the base layer comprises a metal with a melting point of at least 1100° C. and, wherein
   the base layer is made of tungsten/molybdenum and the base layer has a layer thickness between 5 and 20 μm;
   the solderable layer is made of copper and the solderable layer has a layer thickness between 2 and 15 μm; and
   an additional layer is arranged between the solderable layer and the oxidation protection layer and is made of palladium and the additional layer has a layer thickness between 0.5 and 3.0 μm.

2. The metallization layer of claim 1, wherein
   the adhesion layer is made of palladium and has a layer thickness between 0.3 and 1.3 μm.

3. The metallization layer of claim 1, wherein
   the oxidation protection layer is made of gold and/or the oxidation protection layer has a layer thickness between 0.3 and 1.5 μm.

4. The metallization layer of claim 1, wherein
   the base layer is arranged directly on the ceramic and/or the adhesion layer is arranged directly on the base layer and/or the solderable layer is arranged directly on the adhesion layer.

5. The metallization layer of claim 1, wherein
   the oxidation protection layer is arranged directly on the solderable layer.

6. A ceramic comprising a metallization layer according to claim 1, wherein the ceramic is a HTCC ceramic.

7. A cavity housing for receiving a component, having a bottom part and a cover part, wherein the bottom part and the cover part comprises a ceramic according to claim 6.

8. The cavity housing of claim 7, wherein the component is a SAW component.

9. The use of the ceramic of claim 6 for mounting a component by way of a die-bond and/or a wire bond process or by way of flip-chip bonding.

* * * * *